United States Patent
Sung et al.

(10) Patent No.: US 10,104,770 B2
(45) Date of Patent: Oct. 16, 2018

(54) TOUCH PANEL, PREPARING METHOD THEREOF, AND AG—PD—ND ALLOY FOR TOUCH PANEL

(71) Applicant: 3M INNOVATIVE PROPERTIES COMPANY, St. Paul, MN (US)

(72) Inventors: Kihoon Sung, Suwon (KR); JaeHoon Jeong, Gyeonggi-do (KR); Muthu Sebastian, Singapore (SG); Woo-Young Ahn, Gyeonggi-Do (KR); Bong Hyun Cho, Chungcheongnam-do (KR)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 286 days.

(21) Appl. No.: 14/782,502

(22) PCT Filed: Mar. 13, 2014

(86) PCT No.: PCT/US2014/025250
§ 371 (c)(1),
(2) Date: Oct. 5, 2015

(87) PCT Pub. No.: WO2014/168712
PCT Pub. Date: Oct. 16, 2014

(65) Prior Publication Data
US 2016/0057858 A1 Feb. 25, 2016

(30) Foreign Application Priority Data
Apr. 9, 2013 (KR) .................. 10-2013-0038625

(51) Int. Cl.
*B32B 15/04* (2006.01)
*H05K 1/09* (2006.01)
(Continued)

(52) U.S. Cl.
CPC .................. *H05K 1/09* (2013.01); *C22C 5/06* (2013.01); *C23C 14/185* (2013.01);
(Continued)

(58) Field of Classification Search
USPC ......................................... 428/688, 689, 697
See application file for complete search history.

(56) References Cited

U.S. PATENT DOCUMENTS

| 5,886,763 | A | 3/1999 | Wolkowicz |
| 9,152,256 | B2 | 10/2015 | Kim et al. |

(Continued)

FOREIGN PATENT DOCUMENTS

| CN | 102216886 | 10/2011 |
| CN | 102216887 | 10/2011 |

(Continued)

OTHER PUBLICATIONS

International Search Report for PCT International Application No. PCT/US2014/025250 dated Jun. 30, 2014, 3 pages.

*Primary Examiner* — Lauren R Colgan
(74) *Attorney, Agent, or Firm* — Clifton F. Richardson

(57) ABSTRACT

Provided is a touch panel comprising: a transparent substrate, a transparent conductive material disposed on the 5 substrate, and a Ag—Pd—Nd alloy layer disposed on the transparent conductive material. Provided are also a preparation method of the touch panel and a display comprising the touch panel. Provided are also a Ag—Pd—Nd alloy for touch panel, comprising: 97.9 to 99.2 weight % of Ag, 0.7 to 1.8 weight % of Pd, and 0.1 to 0.3 weight % of Nd, based on 100 weight % of the alloy.

19 Claims, 7 Drawing Sheets

(51) Int. Cl.
  *G06F 3/041* (2006.01)
  *G06F 3/044* (2006.01)
  *G06F 3/045* (2006.01)
  *C22C 5/06* (2006.01)
  *C23C 14/18* (2006.01)
  *C23C 14/34* (2006.01)
  *H05K 1/03* (2006.01)

(52) U.S. Cl.
  CPC .......... *C23C 14/3407* (2013.01); *G06F 3/041* (2013.01); *G06F 3/044* (2013.01); *G06F 3/045* (2013.01); *G06F 3/0412* (2013.01); *H05K 1/032* (2013.01); *G06F 2203/04103* (2013.01); *G06F 2203/04804* (2013.01)

(56) References Cited

U.S. PATENT DOCUMENTS

| | | | |
|---|---|---|---|
| 2002/0127353 A1* | 9/2002 | Yoshikawa | G06F 3/041 428/1.1 |
| 2003/0170925 A1 | 9/2003 | Kim | |
| 2005/0008883 A1* | 1/2005 | Takagi | C23C 14/024 428/469 |
| 2005/0118436 A1 | 6/2005 | Bhangale | |
| 2005/0153162 A1* | 7/2005 | Takagi | C22C 5/06 428/673 |
| 2005/0252390 A1 | 11/2005 | Chen | |
| 2007/0026232 A9 | 2/2007 | Sasaki | |
| 2007/0110968 A1 | 5/2007 | Watanabe | |
| 2007/0148033 A1* | 6/2007 | Obata | C22C 5/06 420/505 |
| 2008/0188020 A1 | 8/2008 | Wei-Min | |
| 2010/0051973 A1* | 3/2010 | Kobayashi | H01L 51/5092 257/88 |
| 2010/0328247 A1 | 12/2010 | Miki | |
| 2011/0003173 A1 | 1/2011 | Watanabe | |
| 2011/0141034 A1 | 6/2011 | Lai | |
| 2011/0298725 A1 | 12/2011 | Yeh et al. | |
| 2011/0304568 A1 | 12/2011 | Kim et al. | |
| 2012/0279759 A1 | 11/2012 | Chu | |
| 2012/0295071 A1 | 11/2012 | Sato et al. | |
| 2012/0320287 A1 | 12/2012 | Kim | |
| 2014/0036165 A1 | 2/2014 | Takahashi et al. | |
| 2014/0369884 A1* | 12/2014 | Tauchi | B22F 1/0018 420/503 |
| 2017/0164462 A1* | 6/2017 | Gao | H05K 1/028 |

FOREIGN PATENT DOCUMENTS

| | | |
|---|---|---|
| CN | 102543266 | 7/2012 |
| CN | 102630327 | 7/2014 |
| EP | 2722853 | 4/2014 |
| JP | 2004-2929 | 1/2004 |
| JP | 2008-041294 | 2/2008 |
| JP | 2008080743 | 4/2008 |
| JP | 2010-157497 | 7/2010 |
| KR | 10-0908101 | 7/2009 |
| KR | 2010-0119794 | 11/2010 |
| TW | 2011-45125 | 12/2011 |
| WO | WO 2003-101733 | 12/2003 |
| WO | WO 2004-021749 | 3/2004 |
| WO | WO 2006-132410 | 12/2006 |
| WO | WO 2006-132411 | 12/2006 |
| WO | WO 2006-132412 | 12/2006 |
| WO | WO 2006-132413 | 12/2006 |
| WO | WO2013115002 * | 8/2013 |

* cited by examiner

| Classification | Surface of cross-cut area from which flaking has occurred. (Example for six paralleled cuts) |
|---|---|
| 5 | None |
| 4 |  |
| 3 |  |
| 2 |  |
| 1 |  |
| 0 | Greater than 65% |

TOUCH PANEL, PREPARING METHOD THEREOF, AND AG—PD—ND ALLOY FOR TOUCH PANEL

TECHNICAL FIELD

This invention relates to a touch panel, a preparing method thereof, a display including a touch panel, and an alloy for the touch panel.

BACKGROUND

A touch screen panel (TSP) is a panel having a sensor embedded therein, which recognizes coordinate values of touched points and detects the positions to process specific functions, when users press or touch the screen with one or more fingers, without using input devices such as a keyboard and a mouse. The touch panel, which is a main component constituting the touch screen panel (TSP), along with a controller IC, driver software (SW), and the like, is comprised of an upper plate (film) and a lower plate (film or glass). On the upper plate, a transparent electrode or a transparent conductive film (ITO) is deposited. The touch panel serves to detect a signal generating position according to a contact or a change in electrical capacity, thereby transmitting the detected position to the controller IC.

Recently, a demand for touch panel has increased with the growth of a full touch mobile phone. A demand for a touch panel for a notebook and a tablet PC that have a large area has increased.

The touch panel is classified into a resistive touch panel, a capacitive touch panel, an ultrasonic (SAW; Surface Acoustic Wave) touch panel, and an infrared (IR) touch panel, according to applied technologies. Among them, the resistive touch panel and the capacitive touch panel have been mainly used.

In the resistive touch panel, when users touch the substrates with a finger or a pen, the transparent electrodes on the upper and lower substrates disposed at a predetermined distance contact each other and thus electrical signals are generated. As a result, the positions can be detected. The resistive touch panel has advantages in terms of low cost, high accuracy, and miniaturization, and therefore has been mainly used for Personal Digital Assistants (PDAs), Portable Media Players (PMPs), navigation, handset, and the like.

On the other hand, in the capacitive touch panel, when users touch the transparent electrode on the substrate with conductor such as one or more fingers, a signal is transferred through a constant capacitive layer—which is, for example, formed by constant current flowing in a human body when touching the electrode with one or more fingers—formed on an insulating layer and the positions can be detected. The capacitive touch panel has a strong durability, a short reaction time, and excellent light transmission. The capacitive touch panel is more excellent than the resistive touch panel in terms of its multi-touch capability, and therefore has been widely used for mobile devices recently. In a case of the capacitive touch panel, tempered glass or a plastic substrate may be applied on an uppermost layer.

FIG. 1 illustrates a structure of a general touch panel module. A PET layer 10a, two transparent conductive films 20, and glass 10b are sequentially laminated on an LCD panel 50 and each layer is bonded by an optically clear adhesive 40.

A general method of forming a metal circuit wiring on a transparent conductive material is to print silver paste. However, the silver paste printing method is difficult to implement for a circuit having a thickness of 50 μm or less, and therefore a metal deposition method has been used recently. As metal, copper or silver is mainly used. Even in the case of the metal deposition method, the thickness of the deposited metal is 0.3 μm or less, which is much thinner than that in the silver printing method, and therefore copper or silver may be oxidized in the air. Therefore, in order to address the problem, a use of an alloy or coating process has been attempted.

Japanese Patent Application Laid-Open No. 2004-2929 discloses a silver alloy including silver as a main component and elements such as Ti, Zr, Pd, and the like. The silver alloy disclosed is used for a sputtering target and may be used to prepare a reflective LCD reflector or a reflective wiring electrode. However, the literature does not disclose the use of silver alloy for a touch panel. Further, the alloy does not include Nd.

Korean Patent No. 908,101 discloses a touch panel including Cu or Al as a metal coating layer and a preparing method thereof. In addition, a pad for a touch panel uses Cu, Ag, and Al for formation of a pattern and Ni/Cr, Ni/Cu, and Mo for protection from moisture and salt. However, alloys such as Cu and Ni/Cr, Ag and Mo, and the like, that have been used in prior art, are oxidized or stained by high-temperature and high-humidity environment or by the component constituting sweat such as salt so that electrical characteristics have been degrade.

DISCLOSURE OF THE INVENTION

Problems to be Solved

An object of at least one embodiment of this invention is to provide a new touch panel having excellent oxidation stability, a preparing method thereof, and a display including the same by solving the problems of the prior art.

Another object of at least one embodiment of this invention is to provide a Ag—Pd—Nd alloy for a touch panel.

Means to Solve the Problem

In order to address at least one object above, an exemplary embodiment of this invention provides a touch panel comprising: a transparent substrate, a transparent conductive material disposed on the substrate, and a Ag—Pd—Nd alloy layer disposed on the transparent conductive material.

The Ag—Pd—Nd alloy layer may include, in at least one embodiment, 97.9 to 99.2 weight % of Ag, 0.7 to 1.8 weight % of Pd, and 0.1 to 0.3 weight % of Nd, based on a total of 100 weight % of alloy; or in at least one embodiment, 98.45 to 99.05 weight % of Ag, 0.8 to 1.3 weight % of Pd, and 0.15 to 0.25 weight % of Nd, based on a total of 100 weight % of alloy.

The transparent substrate may be selected from a group consisting of polyethylene terephthalate (PET), polybutylene terephthalate (PBT), polyphenylene sulfide, polyimide, polyamidimide, polyethersulfone, polyetherimide, polyetheretherketone, polycarbonate, and glass. In at least one embodiment, the transparent substrate may be polyethyleneterephthalate (PET).

The transparent conductive material may be selected from a group consisting of indium tin oxide (ITO), indium zinc oxide (IZO), zinc oxide (ZnO), indium zinc tin oxide (IZTO), cadmium tin oxide (CTO), PEDOT (poly(3,4-ethylene dioxythiophene), carbon nanotube (CNT), and silver nanowire. In at least one embodiment, the transparent conductive material may be indium tin oxide (ITO).

In at least one embodiment, the Ag—Pd—Nd alloy layer may be formed on the transparent conductive material by deposition or sputtering.

Another exemplary embodiment of this invention provides a preparing method of the touch panel, comprising: a step of providing a transparent substrate formed of a transparent film or glass, a step of laminating the transparent conductive material on the transparent substrate, and a step of forming a Ag—Pd—Nd alloy layer on the transparent conductive material by sputtering.

Yet another exemplary embodiment of this invention provides a display including the touch panel.

Still another exemplary embodiment of this invention provides a Ag—Pd—Nd alloy for touch panel, comprising: 97.9 to 99.2 weight % of Ag, 0.7 to 1.8 weight % of Pd, and 0.1 to 0.3 weight % of Nd, based on 100 weight % of the alloy.

Effect of Invention

According to the exemplary embodiments of this invention, the touch panel and the display including the same can have excellent surface characteristics and oxidation stability due to the Ag—Pd—Nd alloy layer formed on the conductive transparent electrode, thereby extending lifespan.

DETAILED DESCRIPTION OF THE INVENTION

Figure 1:
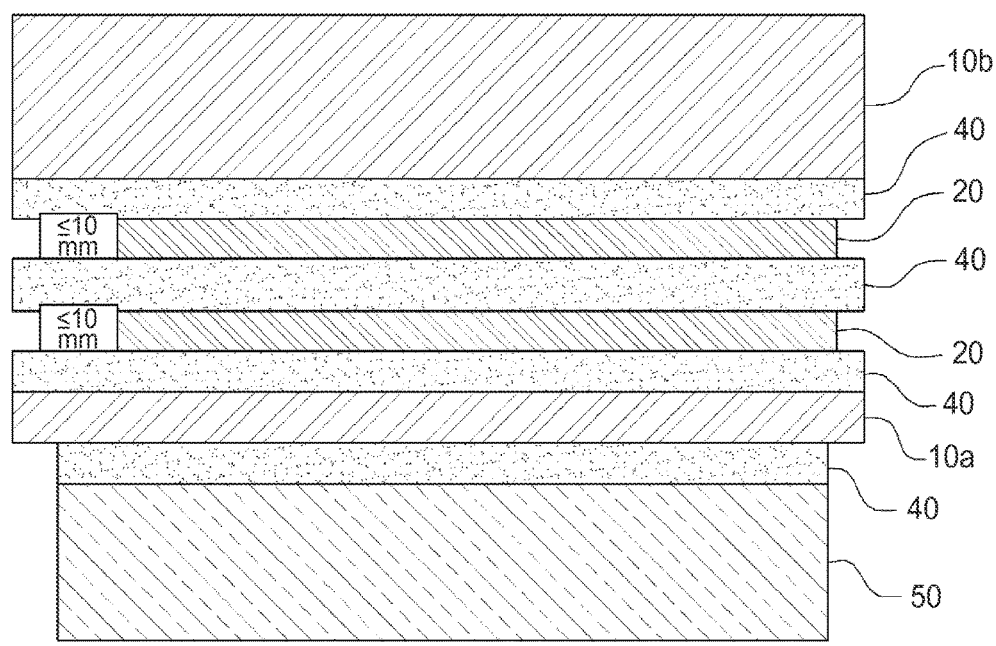
FIG. 1 illustrates a structure of a general touch panel module.

Referring to the drawings, this invention will be explained in detail below.

Figure 2:
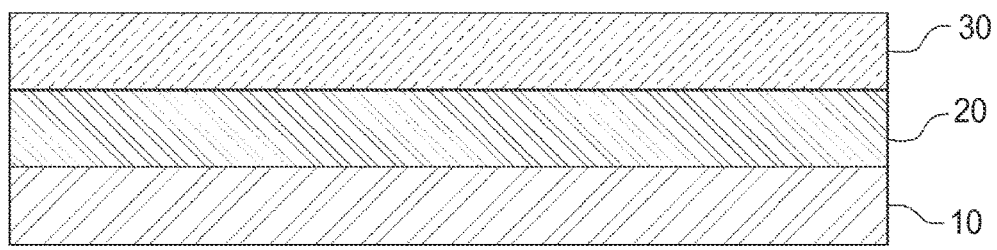
FIG. 2 illustrates a structure of a touch panel according to an exemplary embodiment of this invention.

FIG. 2 illustrates a structure of the touch panel according to an exemplary embodiment of this invention. As illustrated in FIG. 2, the exemplary embodiment of this invention provides a touch panel including a transparent substrate 10, a transparent conductive material 20 disposed on the substrate 10, and a Ag—Pd—Nd alloy layer 30 disposed on the transparent conductive material 20.

In the touch panel, the Ag—Pd—Nd alloy layer 30 includes Ag, Pd, and Nd and may be formed of only them. Pd withstands oxidation, humidity, and heat in air to improve durability. Nd miniaturizes a crystal grain size of an alloy layer and is useful for heat stability. Further, Nd improves surface characteristics. The Ag—Pd—Nd alloy layer 30 may include, 97.9 to 99.2 weight % of Ag, 0.7 to 1.8 weight % of Pd, and 0.1 to 0.3 weight % of Nd, based on a total of 100 weight % of alloy; or may include, in at least one embodiment, 98.45 to 99.05 weight % of Ag, 0.8 to 1.3 weight % of Pd; 0.15 to 0.25 weight % of Nd, based on a total 100 weight %.

In the touch panel, the transparent substrate 10 is formed of a transparent film or glass and has a transparent conductive material 20 disposed thereon. The transparent substrate 10 may be formed of a material selected from a group consisting of polyethylene terephthalate (PET), polybutylene terephthalate (PBT), polyphenylene sulfide, polyimide, polyamidimide, polyethersulfone, polyetherimide, polyetheretherketone, polycarbonate, and glass. In at least one embodiment, the transparent substrate 10 may be formed of polyethyleneterephthalate (PET). In particular, in a case of a resistive touch panel, glass or a PET film may be used and in a case of a capacitive touch panel, a PET film may be used.

In the touch panel, the transparent conductive material 20 is disposed on the transparent substrate 10, and the Ag—Pd—Nd alloy layer 30 is disposed on the transparent conductive material 20. The transparent conductive material 20 may be selected from a group consisting of indium tin oxide (ITO), indium zinc oxide (IZO), zinc oxide (ZnO), indium zinc tin oxide (IZTO), cadmium tin oxide (CTO), PEDOT (poly(3,4-ethylene dioxythiophene)), carbon nanotube (CNT), and silver nanowire. In at least one embodiment, the transparent conductive material may be indium tin oxide (ITO).

The indium tin oxide (ITO) film, which may be formed by thin-film depositing indium oxide ($In_2O_5$)+tin oxide ($SnO_2$) composites on a base film at several tens of nm, has an optical transparency, electrical conductivity, and electrode machinability. Therefore the ITO film has been used for a touch screen, an electroluminescence (EL) backlight, an electromagnetic wave protective film, a solar cell, and the like.

The transparent conductive material and the Ag—Pd—Nd alloy layer may have excellent adhesion or may not have excellent adhesion. For example, when the Ag—Pd—Nd alloy layer is present on a non-crystalline transparent conductive material, the adhesion therebetween is excellent. But when the Ag—Pd—Nd alloy layer is present on a crystalline transparent conductive material, the adhesion may not be excellent according to the degree of crystallization.

In this case, in order to improve the adhesion between the transparent conductive material and the Ag—Pd—Nd alloy layer, a metal layer formed of one or more metals selected from a group consisting of Mo, Ag, Ni, Cu, Ti, and Cr may be further formed between the transparent conductive material and the Ag—Pd—Nd alloy layer. In at least one embodiment, the metal layer is formed of Mo, Mo—Ag alloy, Ni—Cu—Ti alloy, or Ni—Cr alloy. The Mg—Ag alloy layer may contain 50 to 70 weight % of Mo and 30 to 50 weight % of Ag. The Ni—Cr alloy layer may contain 92 to 95 weight % of Ni and 5 to 8 weight % of Cr.

When the metal layer is the Mo layer or the Ni—Cr alloy layer, the thickness thereof may be 1 to 30 nm. In at least one embodiment, the thickness may be 3 to 10 nm. When the metal layer is the Mo—Ag alloy layer or the Ni—Cu—Ti alloy layer, the thickness thereof may be 10 to 50 nm.

A metal layer and a metal alloy layer laminated on the metal layer may be further formed between the transparent conductive material and the Ag—Pd—Nd alloy layer. Herein a lamination may be conducted by a common method such as sputtering. Herein the metal layer is formed of a metal selected from a group consisting of Mo, Ag, Ni, Cu, Ti, and Cr and the metal alloy layer is formed of two or more metals selected from a group consisting of Mo, Ag, Ni, Cu, Ti, and Cr. In at least one embodiment, as the metal layer, Mo may be used and as the metal alloy layer, the Mo—Ag or Ni—Cu—Ti alloy may be used. The Mg—Ag alloy layer may contain 50 to 70 weight % of Mo and 30 to 50 weight % of Ag. When the metal layer is the Mo layer or the metal alloy layer is the Ni—Cr alloy layer, the thickness thereof may be 1 to 30 nm. In at least one embodiment, the thickness thereof may be 3 to 10 nm. When the metal alloy layer is the Mo—Ag alloy layer or the Ni—Cu—Ti alloy layer, the thickness thereof may be 10 to 50 nm.

Figure 3:
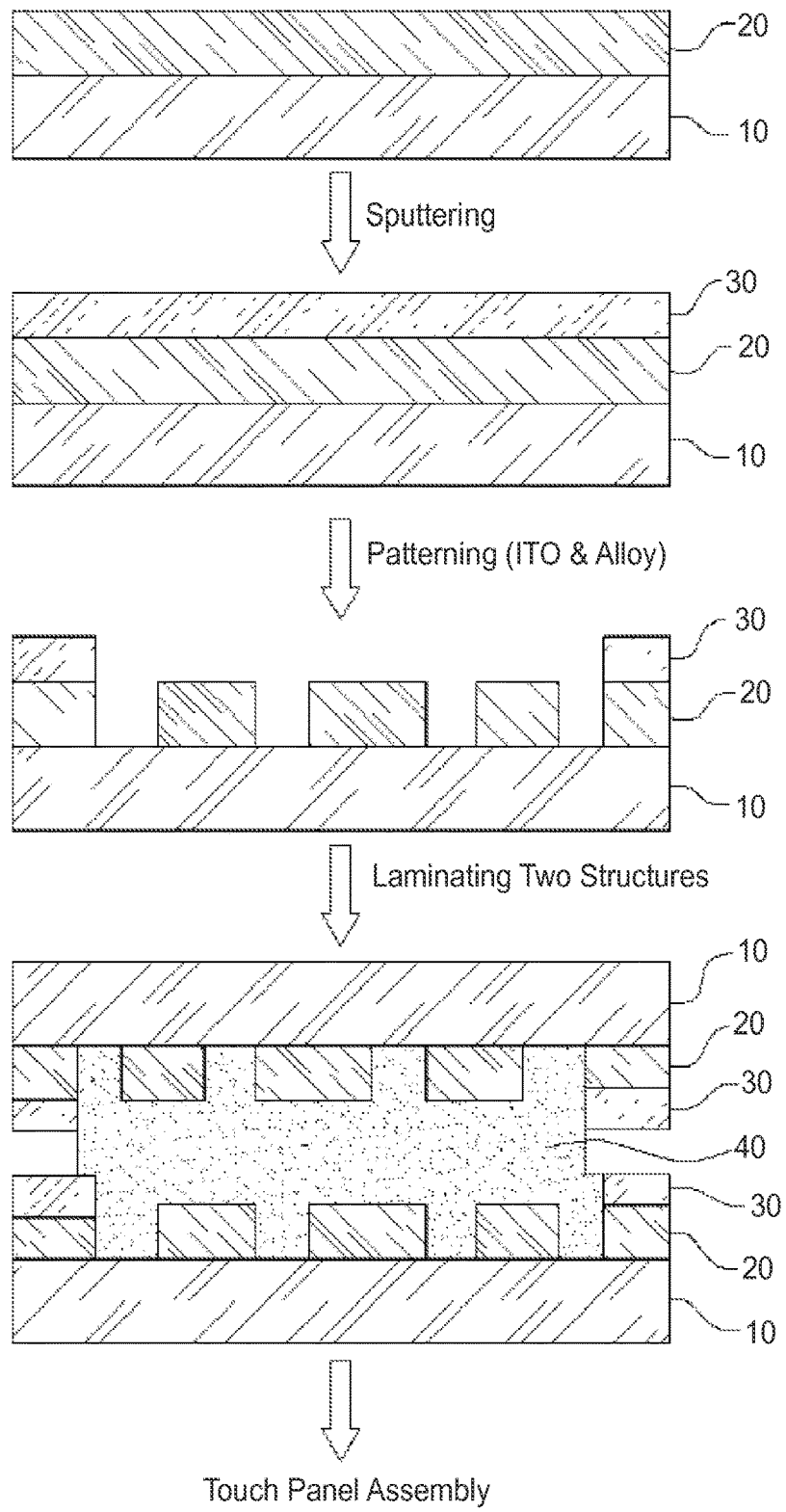
FIG. 3 illustrates a process of preparing one touch panel according to the exemplary embodiment of this invention.

In the touch panel, the Ag—Pd—Nd alloy layer 30 may be formed on the transparent conductive material 20, for example, by deposition or sputtering. For the formation of the Ag—Pd—Nd alloy layer 30, various methods known to those skilled in the art may be used. However, for thin coating, the deposition or the sputtering may be used. FIG. 3 illustrates a process of forming the Ag—Pd—Nd alloy layer 30 on the transparent conductive material 20 by the sputtering, in the touch panel according to the exemplary embodiment of this invention.

In the touch panel, when the transparent film is used as the transparent substrate layer 10, the thickness thereof may be 10 to 1,000 μm, and when glass is used as the transparent substrate layer 10, the thickness thereof may be 100 to 300 μm, in order to make etching process easier, and to minimize difference on height at etching stage. When the thickness of the transparent substrate 10 is within the range, the durability can be secured.

The transparent conductive material coating layer 20 may be formed of 0.005 to 0.1 μm in order for the touch panel to have a low resistance and good transparency without problems at etching stage.

The alloy layer 30 may be formed of 0.01 to 1 μm, in order for the touch panel to have a low resistance and to give a good productivity in manufacturing. When the thicknesses of the alloy layer 30 and the transparent conductive material coating layer 20 are within the range as above, etching process may be easily conducted, and thus, the process time may be reduced.

One exemplary embodiment of this invention provides a method of preparing the touch panel including providing the transparent substrate 10 formed of a transparent film or glass, laminating the transparent conductive material 20 on the transparent substrate 10, and forming the Ag—Pd—Nd alloy layer 30 on the transparent conductive material 20 by sputtering.

The conventional touch panel using silver paste was manufactured by preparing a lower panel and then coupling the lower panel with other laminated layers. The method to prepare a lower panel is as follows:

laminating the transparent conductive material on the transparent substrate and then heat-treating the transparent conductive material, a photolithography process including PR coating, exposing, developing, etching, and stripping for forming a pattern for the transparent conductive material layer, a process of machining a guide for setting a reference for forming a silver paste pattern on an upper surface on which the transparent conductive material pattern is formed, a process of printing the silver paste based on the machined guide, and a high-temperature curing process for curing the silver paste.

In the touch panel, when the metal coating layer 30 is already formed on the transparent conductive material layer 20, the guide machining and the curing process are not required.

FIG. 3 illustrates a process of manufacturing a touch panel according to the exemplary embodiment of this invention. First, the ITO layer 20 as the transparent conductive material is laminated on the transparent substrate 10. The Ag—Pd—Nd alloy layer 30 is formed on the ITO layer 20 by the sputtering and then, the ITO layer 20 and the alloy layer 30 are patterned. Another laminated structure is formed by forming and patterning the ITO layer 20 and the Ag—Pd—Nd alloy layer 30 on the transparent substrate 10 in the same manner. When two laminated structures are bonded using the optical clear adhesive 40, the touch panel assembly formed with the pattern is formed.

As the method for forming the pattern, general methods known to those skilled in the art such as the photolithography process may be used.

Both the capacitive touch panel and the resistive touch panel may be used. In this case, a process of coupling an adhesive layer and a dielectric layer formed of an insulator on the upper surface of the pad formed with the pattern may be conducted. Or a process of turning over another pad formed with the pattern to be coupled on the upper surface of the pad formed with the pattern so as to be spaced apart from each other vertically is performed.

In detail, in a case of the capacitive touch panel, the panel may be formed on the upper surface of the pad formed with the pattern by coupling the adhesive layer with an insulating layer of an insulator. The capacitive type touch panel may be configured to include, in addition to the pad having the transparent substrate 10 formed of a transparent film or glass, the transparent conductive material 20 on the substrate 10, and the Ag—Pd—Nd alloy layer 30 on the transparent conductive material 20; an adhesive layer bonded on the upper surface of the pad; and a dielectric layer formed of an insulator and coupled on the upper surface of the adhesive layer.

The resistive touch panel may be manufactured by performing the process of turning over another pad formed with the pattern to be coupled on the upper surface of the pad formed with the pattern so as to be spaced apart from each other vertically. The space of two pads formed with the facing patterns may be formed by disposing a separating film layer at an edge and may be formed by disposing a spacer in the separated space at a predetermined interval. The resistive touch panel may be configured to include, in addition to the lower pad having the transparent substrate 10 formed of a transparent film or glass, the transparent conductive material coating layer 20 on the substrate 10, and the Ag—Pd—Nd alloy layer 30 formed on the transparent conductive material coating layer 20; a spacer to be bonded on the upper surface of the lower pad or a separate film layer to be bonded at the edge of the upper surface; and an upper pad bonding to the upper of the spacer or the separate film layer, and comprising the transparent substrate 10, the transparent conductive material coating layer 20 on the lower surface of the transparent substrate 10, and the Ag—Pd—Nd alloy layer 30 formed on the lower surface of the transparent conductive material coating layer 20.

The exemplary embodiment of this invention also provides a display including the touch panel. As illustrated in FIG. 1, the display may be used as the 20 touch panel type display by including the display device such as an LCD 50 on the lower part of the touch panel.

The exemplary embodiment of this invention also provides the Ag—Pd—Nd alloy for the touch panel containing 97.9 to 99.2 weight % of Ag, 0.7 to 1.8 weight % of Pd, and 0.1 to 0.3 weight % of Nd, based on a total of 100 weight % of alloy. More specifically, the Ag—Pd—Nd alloy contains 98.45 to 99.05 weight % of Ag, 0.8 to 1.3 weight % of Pd, and 0.15 to 0.25 weight % of Nd, based on a total of 100 weight % of alloy.

Hereinafter, Examples of this invention will be described in detail. However, these Examples are to describe in detail this invention and the scope of this invention is not limited to these Examples.

EXAMPLE 1

Sample 1 with a size of 100×100 mm was prepared by sputtering the Ag—Pd—Nd alloy with a thickness of 0.15 μm on the crystallized ITO film (PET based ITO film). Samples 2 to 4 having the same size as in sample 1, were prepared in the same manner. Sample 5 with the same size was prepared in the same manner except that the thickness of the Ag—Pd—Nd alloy is 0.1 μm. Samples 6 to 8 having the same size were prepared in the same manner as in Sample 5. In the used alloy, the contents of Ag, Pd, and Nd were 98.8 weight %, 1.0 weight %, and 0.2 weight %, respectively.

TABLE 1

| Layer | Samples 1 to 4 | Samples 5 to 8 |
| --- | --- | --- |
| Alloy layer | Ag—Pd—Nd Alloy with a thickness of 0.15 μm | Ag—Pd—Nd Alloy with a thickness of 0.10 μm |
| Transparent conductive material layer | ITO film | ITO film |
| Transparent substrate layer | PET | PET |

COMPARATIVE EXAMPLE 1

The six comparative samples (comparative samples 1 to 6) with a size of 100×100 mm were prepared by forming Ni/Cr of 10 nm on PET having a thickness of 5 μm, Cu of 8 μm on Ni/Cr, and Ni/Cr of 30 nm on Cu, as shown in below table 2. Herein, as the adhesion of Cu with respect to the PET is not excellent, the Ni/Cr on the PET is used to reinforce the adhesion. The Ni/Cr on the Cu is used to protect from the external environment.

TABLE 2

| Layer | Comparative samples 1 to 6 |
| --- | --- |
| Metal or Alloy layer | 30 nm Ni/Cr<br>8 μm Cu<br>10 nm Ni/Cr |
| Transparent Substrate Layer | 5 mm PET |

Sample 1 and comparative samples 1 to 6 were subjected to a stress test such as the temperature humidity test and the salt spray test.

Experiment 1—Temperature Humidity Test

As described below, samples 1 to 4 and comparative samples 1 to 6 were subjected to the temperature humidity test using ESPEC and PR-2SP. The test method and the system used were IEC749, Semiconductor Device mechanical and Climatic Test Method, and JIS C 7021, Type Designation System for Discrete Semiconductor Device, respectively.

Samples 1 to 4 were subjected to the temperature humidity test twice.

First, samples 1 to 4 were maintained under 85° C. and a relative humidity of 85% for 120 hours, and left at a room temperature for 24 hours. Then, whether or not 5 the corrosion occurs was observed.

Next, samples 1 to 4 were subjected to the same test except that the samples were maintained under 85° C. and a relative humidity of 85% for 192 hours. Then, whether or not the corrosion occurs was observed.

Comparative samples 1 to 6 were maintained under 85° C. and a relative humidity of 85% for 144 hours and left at a room temperature for 24 hours. Then, whether or not the corrosion thereof occurs was observed.

The results were shown in the following Table 3.

TABLE 3

| | | Whether or not Oxidation Point is observed |
| --- | --- | --- |
| First (120 hrs) | Samples 1 to 4 | None |
| Second (192 hrs) | Samples 1 to 4 | None |
| Comparative samples 1 | | None |
| Comparative samples 2 | | Observed |
| Comparative samples 3 to 6 | | None |

As described above, samples 1 to 4 did not show the oxidation point through the first and the second experiments. Therefore the corrosion did not occur. Comparative Sample 2 showed the oxidation point, and therefore the corrosion thereof occurred.

Figure 4A:
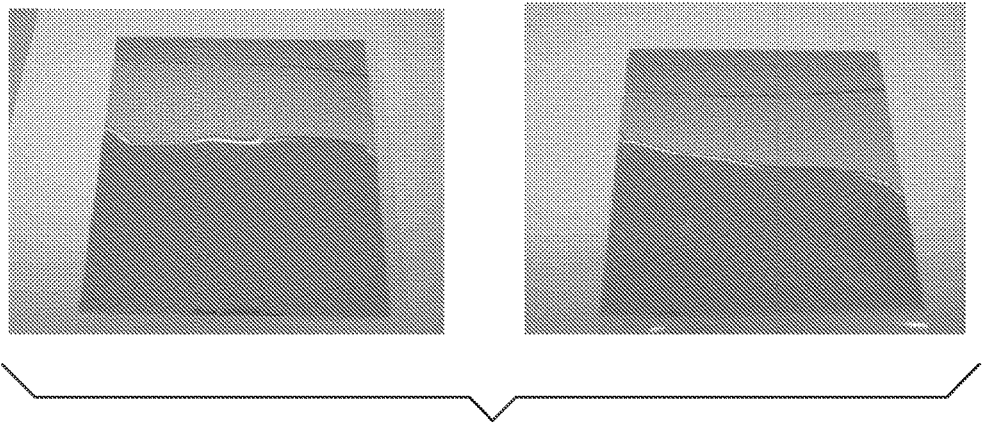
FIG. 4A illustrates an initial photograph (left) of one of the samples of Example 1 and a photograph (right) after a temperature humidity test.
Figure 4B:
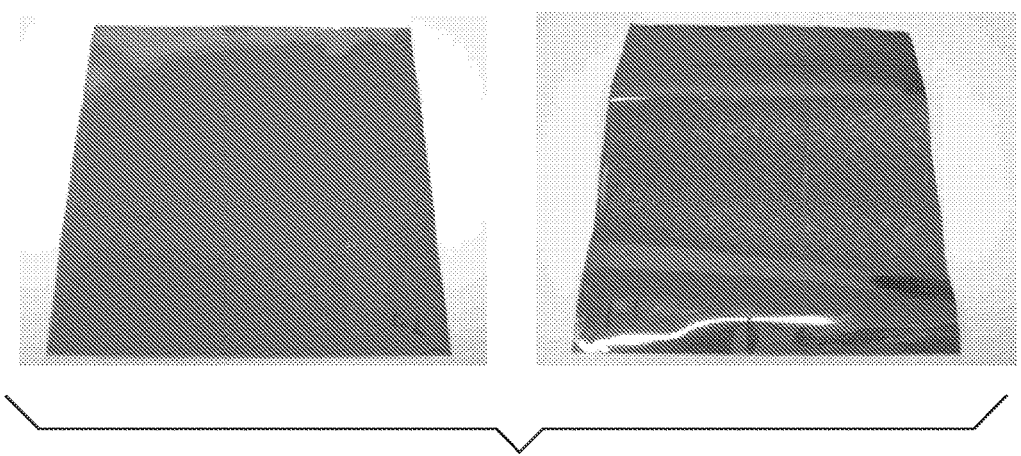
FIG. 4B illustrates an initial photograph (left) of one (sample in which an oxidization point is generated, as a result of a temperature humidity test) of the samples of Comparative Example 1 and a photograph (right) after a temperature humidity test.

FIG. 4A illustrates an initial photograph (left) of sample 1 and a photograph (right) after a temperature humidity test. FIG. 4B illustrates an initial photograph (left) of comparative sample 2 and a photograph (right) after a temperature humidity test. An oxidization point was generated in this sample as a result of a temperature humidity test.

Referring to FIGS. 4A and 4B, both sample 1 and comparative sample 2 were shown in unblemished condition prior to testing. After the temperature humidity test, it could be appreciated that sample 1 has a slight spot, but maintains the relatively unblemished form (right of FIG. 4A), while comparative sample 2 has the oxidation point (right of FIG. 4B).

Experiment 2—Surface Resistance Test

Samples 1 to 4 and comparative samples 1 to 6 were measured for surface resistance at six points at an interval of 10 mm in a Transverse Direction (TD) by using a 4 probe tester. The surface resistance value was initially measured and measured after the temperature humidity test. The average value of the results is shown in the following Table 4.

TABLE 4

|  | Initial Resistance Value | After 120 hours | After 144 hours | After 192 hours |
|---|---|---|---|---|
| Samples 1 to 4 | 0.21 ± 0.01 Ω | 0.19 ± 0.01Ω |  | 0.19 ± 0.01 Ω |
| Comparative samples 1 to 6 | 6.1 mΩ |  | 8.5 mΩ |  |

As described above, it was observed that samples of example 1 have a slightly reduced resistance value even after the predetermined time lapses, while the resistance value of the comparative samples of comparative example 1 is largely increased.

Experiment 3—Salt Spray Test (1) Samples 5 and 6 were subjected to the salt spray test by a KS D9502 method. The test was subjected to various intervals of salt spray time such as 24 hours, 48 hours, and 72 hours.

The NaCl concentration of the salt water used for the test was 5±1% and the temperature was 35±2° C. Each sample was sprayed with the salt water for 24 hours, 48 hours, and 72 hours, cleaned with a soft brush for 7 minutes in room temperature water, and dried for next 1 hour. Then, whether or not corrosion occurs was observed.

(2) Comparative samples 1 to 6 were subjected to the salt spray test by the same method. Then, whether or not corrosion occurs was observed.

(3) In addition, samples 7 and 8 were subjected to the salt spray test in the same manner as in (1) except that the cleaning with a soft brush was skipped. Then, whether or not corrosion occurs was observed.

Test results of the (1), (2), and (3) are shown in the following Table 5.

TABLE 5

|  | Salt Spray Hour | Cleaning Method | Where or not Corrosion occurs |
|---|---|---|---|
| Sample 5 | 24 hours | Cleaning using brush | Absence |
|  | 48 hours |  | Absence |
|  | 72 hours |  | Absence |
| Sample 6 | 24 hours |  | Absence |
|  | 48 hours |  | Absence |
|  | 72 hours |  | Absence |
| Sample 7 | 48 hours | Cleaning in flowing water | Absence |
|  | 72 hours |  | Absence |
| Sample 8 | 48 hours |  | Absence |
|  | 72 hours |  | Absence |
| Comparative Sample 1 | 24 hours | Cleaning using brush | Occurrence |
|  | 48 hours |  | Occurrence |
| Comparative Sample 2 | 24 hours | Cleaning using brush | Occurrence |
|  | 48 hours |  | Occurrence |

As can be seen in Table 5, in samples 5 to 8, when the salt spray test was performed for 24 hours, 48 hours, and 72 hours, the corrosion did not occur independent of the cleaning method. However, in the comparative samples of Comparative Example 1, when the test was performed for 24 hours and 48 hours, the corrosion thereof was observed in all cases.

Experiment 4—Stripping Test

Samples 9 and 10, which have the same structure as sample 1 except that the alloy has contents in the following Table 6 were subjected to the salt spray test and then the stripping test according to a IPC-TM-650 2.4.1.6 Grid Test method using a 3M 600 (acrylic) tape.

TABLE 6

|  | Ag | Pd | Nd |
|---|---|---|---|
| Sample 9 | 99.3% | 0.5% | 0.2% |
| Sample 10 | 99.1% | 0.7% | 0.2% |
| Sample 1 | 98.8% | 1.0% | 0.2% |

Figure 5A:
FIG. 5A illustrates an appearance of a sample subject to a stripping test after a salt spray test, which comprises an alloy containing 99.3% of Ag, 0.5% of Pd, and 0.2% of Nd.
Figure 5B:
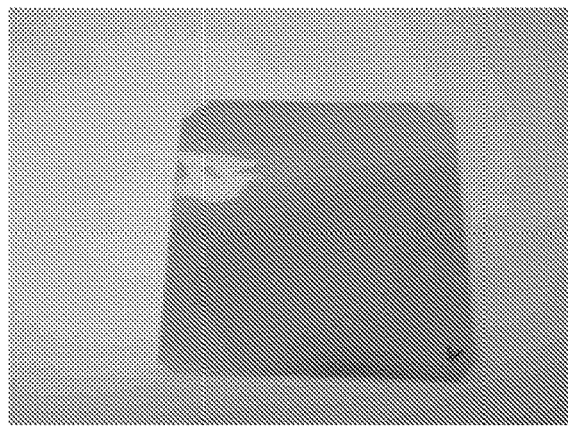
FIG. 5B illustrates an appearance of a sample subject to a stripping test after a salt spray test, which comprises an alloy containing 99.1% of Ag, 0.7% of Pd, and 0.2% of Nd.
Figure 5C:
FIG. 5C illustrates an appearance of a sample subject to a stripping test after a salt spray test, which comprises an alloy containing 98.8% of Ag, 1.0% of Pd, and 0.2% of Nd.

The test results are shown in FIGS. 5A to 5C. As could be seen in FIG. 5C, sample 1 was not stripped well, and therefore was shown as having the most excellent adhesion. Next, samples 10 was shown as having excellent adhesion, and then sample 9 was shown as having good adhesion.

EXAMPLE 2

After the metal layer was formed by sputtering Mo on the crystallized ITO film, sample 11 was manufactured by sputtering the Ag—Pd—Nd alloy on the metal layer. In the sample, the thickness of the Mo metal layer was 10 nm. The thickness of the Ag—Pd—Nd alloy layer was 100 nm and the contents of Ag, Pd, and Nd were 98.8 weight %, 1.0 weight %, and 0.2 weight %, respectively.

EXAMPLE 3

After the metal layer was formed by sputtering the Mo—Ag alloy on the crystallized ITO film, sample 12 was manufactured by sputtering the Ag—Pd—Nd alloy on the metal layer. The thickness of the Mo—Ag alloy layer was 30 nm and the contents of Mo and Ag were 60 weight % and 40 weight %, respectively. The thickness of the Ag—Pd—Nd alloy layer was 100 nm and the contents of Ag, Pd, and Nd were 98.8 weight %, 1.0 weight %, and 0.2 weight %, respectively.

EXAMPLE 4

After the metal layer was formed by sputtering Mo on the crystallized ITO film and the Mo—Ag alloy layer is formed on the metal layer, sample 13 was manufactured by sputtering the Ag—Pd—Nd alloy on the alloy layer. The thickness of the Mo metal layer was 10 nm. The thickness of the Mo—Ag alloy layer was 30 nm and the contents of Mo and Ag were 60 weight % and 40 weight %, respectively. The thickness of the Ag—Pd—Nd alloy layer was 100 nm and the contents of Ag, Pd, and Nd were 98.8 weight %, 1.0 weight %, and 0.2 weight %, respectively.

EXAMPLE 5

After the metal layer was formed by sputtering Mo on the crystallized ITO film and the Ni—Cu—Ti alloy layer is formed on the metal layer, sample 14 was manufactured by sputtering the Ag—Pd—Nd alloy on the alloy layer. The thickness of the Mo metal layer was 10 nm. The thickness of the Ni—Cu—Ti alloy layer was 30 nm and the contents of Ni, Cu, and Ti were 60 weight %, 39.7 weight %, and 0.3 weight %, respectively. The thickness of Ag—Pd—Nd alloy was 100 nm and the contents of Ag, Pd, and Nd were 98.8 weight %, 1.0 weight %, and 0.2 weight %, respectively.

EXAMPLE 6

After the alloy layer was formed by sputtering the Ni—Cu—Ti alloy on the crystallized ITO film, sample 15 was manufactured by sputtering the Ag—Pd—Nd alloy on the alloy layer. The thickness of Ni—Cu—Ti alloy was 30 nm and the contents of Ni, Cu, and Ti were 60 weight %, 39.7 weight %, and 0.3 weight %, respectively. The thickness of Ag—Pd—Nd alloy was 100 nm and the contents of Ag, Pd, and Nd were 98.8 weight %, 1.0 weight %, and 0.2 weight %, respectively.

EXAMPLE 7

After the alloy layer was formed by sputtering the Ni—Cr alloy on the crystallized ITO film, sample 16 was manufactured by sputtering the Ag—Pd—Nd alloy on the alloy layer. The thickness of the Ni—Cr alloy was 10 nm and the contents of Ni and Cr each were 95 weight % and 5 weight %. The thickness of Ag—Pd—Nd alloy was 100 nm and the contents of Ag, Pd, and Nd were 98.8 weight %, 1.0 weight %, and 0.2 weight %, respectively.

The following Table 7 shows the configuration of the samples described in Examples 1 to 7.

TABLE 7

|  | Sample 1 of example 1 | Sample 11 of example 2 | Sample 12 of example 3 | Sample 13 of example 4 | Sample 14 of example 5 | Sample 15 of example 6 | Sample 16 of example 7 |
|---|---|---|---|---|---|---|---|
| APD | ○ | ○ | ○ | ○ | ○ | ○ | ○ |
| Mo—Ag Alloy | X | X | ○ | ○ | X | X | X |
| Ni—Cu—Ti Alloy | X | X | X | X | ○ | ○ | X |
| Ni—Cr Alloy | X | X | X | X | X | X | ○ |
| Mo | X | ○ | X | ○ | ○ | X | X |
| ITO | ○ | ○ | ○ | ○ | ○ | ○ | ○ |

Experiment 5

The etching test and the stripping test were conducted. Specific test method and evaluation method are as follows:

Etching Test (1) First, a HNO3 corrosion solution having a base of 65% was prepared and then, the substrate was cut into small pieces of 10×100 mm and then was dipped in the corrosion solution for 90 second.

(2) The sample was taken out from the corrosion solution and was immediately washed off with deionized water for 1 minute.

(3) It was confirmed with eyes whether the APD or the intermediate layer residual matters are present on the surface of the sample.

(4) The sheet resistance of the sample was measured using a 4 probe sheet resistance meter.

(5) As the measurement result, after the etching, it was shown that only the ITO layer is present on the substrate. This means that the APD alloy and any intermediate metal (or metal alloy) layer may be etched without damaging the ITO layer, such that the corrosion prevention performance of the ITO layer was successfully kept in the HNO3 solution.

(6) Generally, the substrate may successfully pass through the HNO3 etching test.

Figure 6A:
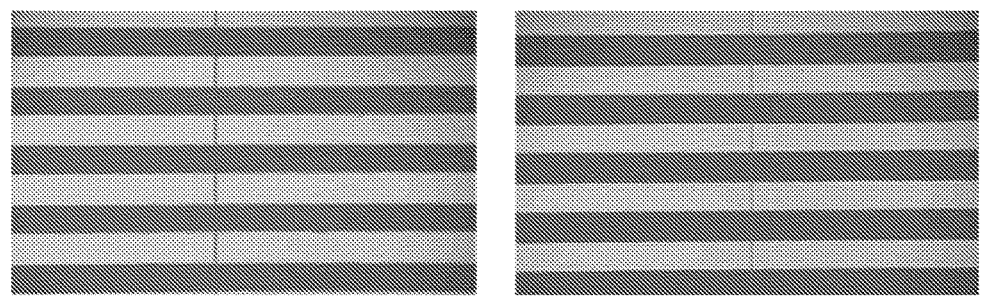
FIG. 6A illustrates excellent straightness as a result of an etching test and FIG. 6B illustrates a rough pattern at the time of etching.
Figure 6B:
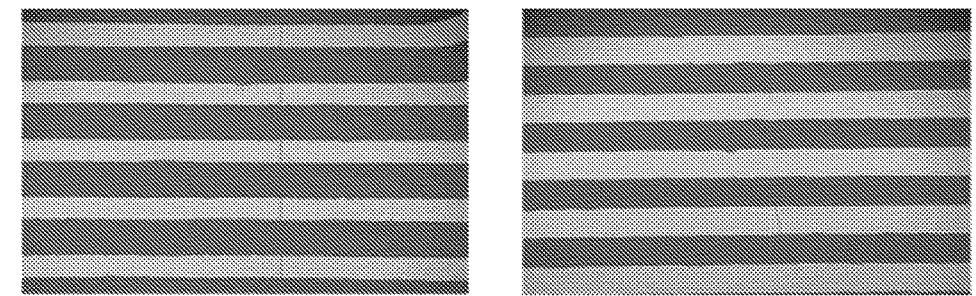

At the time of etching, when the straightness of edges is excellent as illustrated in FIG. 6A, it is represented as 'excellent', and when protrusions or a rough portion having a mouse bite shape is present as illustrated in FIG. 6B, it is represented as 'roughness'.

Stripping Test

The stripping test was conducted according to a IPC-TM-650 2.4.1.6 Grid Test method by using a 3M 600 (acrylate) tape. The reference of the stripping strength is as follows:

Grade 5: a corner of a line pattern is substantially clean. No square of a lattice is found.

Grade 4: the metal layer (sputtering layer) is slightly peeled off at an intersecting point of the lattice—less than 5% of a lattice.

Grade 3: the metal layer (sputtering layer) is slightly peeled off along the corner of the lattice and at an intersecting point—5 to 15% of a lattice.

Grade 2: the metal layer (sputtering layer) is peeled off at a part of a square and along a corner—15% to 35% of a lattice.

Grade 1: the coating is peeled off along the corner of the line pattern in a long ribbon—35% to 65% of a lattice.

Grade 0: the lattice shape is found over 65%.

Figure 7:
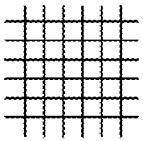
FIG. 7 illustrates a grade of stripping strength through a section at which flaking is generated.
Figure 7:
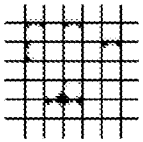
Figure 7:
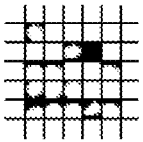
Figure 7:
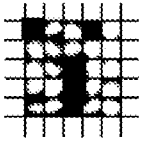

The section with the flaking occurring according to each grade is illustrated in FIG. 7.

In the following Table 8, the investigation results of the etching, and post-etching residuals of the samples of Examples 1 to 4 with a size of 10×100 mm are shown.

TABLE 8

|  | Etching | Post-Etching Residuals (90 second) |
|---|---|---|
| Sample 1 of Example 1 | Excellent | Absence |
| Sample 11 of Example 2 | Excellent | Absence |
| Sample 12 of Example 3 | Excellent | Absence |
| Sample 13 of Example 4 | Excellent | — |

*Result at the time of forming a film on ITO that is hard to form the metal layer due to crystallization.

In the following Table 9, the investigation results of the stripping strength and post-etching residuals of the samples of Examples 5 to7 are shown.

TABLE 9

|  | Stripping Strength | Post-Etching Residuals (90 second) |
|---|---|---|
| Sample 14 of Example 5 | Grade 5 | Absence |
| Sample 15 of Example 6 | Grade 5 | Absence |
| Sample 16 of Example 7 | Grade 5 | Presence |

*Result at the time of forming a film on ITO that is hard to form the metal layer due to crystallization.

From the foregoing, it will be appreciated that various embodiments of this invention have been described herein for purposes of illustration, and that various modifications may be made without departing from the scope and spirit of this invention. Accordingly, the various embodiments disclosed herein are not intended to be limiting, with the true scope and spirit being indicated by the following claims.

DRAWING REFERENCE NUMBERS

10: Transparent Substrate
10a: PET
10b: Glass
20: Transparent Conductive Material
15 30: Ag—Pd—Nd Alloy Layer
40: Optical Transparent Adhesive
50: LCD Panel

What is claimed is:

1. A touch panel comprising:
   a transparent substrate;
   a transparent conductive material disposed on the substrate;
   an Ag—Pd—Nd alloy layer disposed on the transparent conductive material;
   a metal layer disposed between the transparent conductive material and the Ag—Pd—Nd alloy layer, the metal layer being a Mo layer, a Mo—Ag alloy layer, a Ni—Cu—Ti alloy layer, or a Ni—Cr alloy layer
   optionally a metal alloy layer disposed between the transparent conductive material and the Ag—Pd—Nd alloy layer; and
   wherein the Ag—Pd—Nd alloy layer is disposed directly on the metal layer or directly on a metal alloy layer.

2. The touch panel of claim 1, wherein the metal layer is the Mo layer.

3. The touch panel of claim 2, further comprising:
   a metal alloy layer disposed on the metal layer between the transparent conductive material and the Ag—Pd—Nd alloy layer, the metal alloy layer being a Mo—Ag alloy layer or a Ni—Cu—Ti alloy layer.

4. The touch panel of claim 3, wherein the Ag—Pd—Nd alloy layer is disposed directly on the metal alloy layer, and the metal alloy layer is disposed directly on the metal layer.

5. The touch panel of claim 4, wherein the metal layer is disposed directly on the transparent conductive material.

6. The touch panel of claim 1, wherein the Ag—Pd—Nd alloy layer comprises:
   97.9 to 99.2 weight % of Ag,
   0.7 to 1.8 weight % of Pd, and
   0.1 to 0.3 weight % of Nd,
   based on 100 weight % of the alloy.

7. The touch panel of claim 6, wherein the Ag—Pd—Nd alloy layer comprises:
   98.45 to 99.05 weight % of Ag,
   0.8 to 1.3 weight % of Pd, and
   0.15 to 0.25 weight % of Nd,
   based on the 100 weight % of the alloy.

8. The touch panel of claim 1, wherein the transparent substrate is selected from the group consisting of polyethylene terephthalate (PET), polybutylene terephthalate (PBT), polyphenylene sulfide, polyimide, polyamide imide, polyether sulfon, polyether imide, polyether ether ketone, polycarbonate and glass.

9. The touch panel of claim 8, wherein the transparent substrate is polyethylene terephthalate (PET).

10. The touch panel of claim 1, wherein the transparent conductive material is selected from the group consisting of indium tin oxide (ITO), indium zinc oxide (IZO), zinc oxide (ZnO), indium zinc tin oxide (IZTO), cadmium tin oxide (CTO), PEDOT(Poly(3,4-ethylenedioxythiophene)), carbon nanotube (CNT) and silver nanowire.

11. The touch panel of claim 1, wherein the transparent conductive material is indium tin oxide (ITO).

12. The touch panel of claim 1, wherein the Ag—Pd—Nd alloy layer is formed on the transparent conductive material by evaporation or sputtering.

13. The touch panel of claim 1, wherein the Ag—Pd—Nd alloy layer is disposed directly on the metal layer.

14. The touch panel of claim 13, wherein the metal layer is disposed directly on the transparent conductive material.

15. A method of making the touch panel of claim 1, comprising:
    a step of providing a transparent substrate formed of a transparent film or glass;
    a step of laminating the transparent conductive material on the transparent substrate, and
    a step of forming an Ag—Pd—Nd alloy layer on the transparent conductive material by sputtering.

16. A display comprising the touch panel of claim 1.

17. A touch panel, comprising:
    an Ag—Pd—Nd alloy layer disposed directly on a metal layer,
    wherein the metal layer is formed of at least one metal selected from the group consisting of Mo, Ag, Ni, Cu, Ti and Cr, and
    wherein the Ag—Pd—Nd alloy layer comprises:
    97.9 to 99.2 weight % of Ag,
    0.7 to 1.8 weight % of Pd, and
    0.1 to 0.3 weight % of Nd,
    based on 100 weight % of the alloy.

18. The touch panel of claim 17, wherein the Ag—Pd—Nd alloy layer comprises:
    98.45 to 99.05 weight % of Ag,
    0.8 to 1.3 weight % of Pd, and
    0.15 to 0.25 weight % of Nd,
    based on the 100 weight % of the alloy.

19. The touch panel of claim 17, wherein the metal layer is a Mo layer, a Mo—Ag alloy layer, a Ni—Cu—Ti alloy layer, or a Ni—Cr alloy layer.

* * * * *

UNITED STATES PATENT AND TRADEMARK OFFICE
CERTIFICATE OF CORRECTION

PATENT NO.        : 10,104,770 B2
APPLICATION NO.   : 14/782502
DATED             : October 16, 2018
INVENTOR(S)       : Kihoon Sung et al.

It is certified that error appears in the above-identified patent and that said Letters Patent is hereby corrected as shown below:

Column 13
Line 20, In Claim 1, after "layer" insert -- ; --.

Signed and Sealed this
Seventh Day of May, 2019

Andrei Iancu
*Director of the United States Patent and Trademark Office*